United States Patent
Lee et al.

(10) Patent No.: US 9,529,257 B2
(45) Date of Patent: Dec. 27, 2016

(54) HARD MASK COMPOSITION AND METHOD FOR FORMING PATTERN USING SAME

(71) Applicant: CHEIL INDUSTRIES INC., Gumi-si, Gyeongsangbuk-do (KR)

(72) Inventors: Chul-Ho Lee, Suwon-si (KR); You-Jung Park, Suwon-si (KR); Yong-Woon Yoon, Suwon-si (KR); Sung-Jae Lee, Suwon-si (KR); Youn-Jin Cho, Suwon-si (KR); Young-Min Kim, Suwon-si (KR); Chung-Heon Lee, Suwon-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 4 days.

(21) Appl. No.: 14/420,957

(22) PCT Filed: Sep. 2, 2013

(86) PCT No.: PCT/KR2013/007873
§ 371 (c)(1),
(2) Date: Feb. 11, 2015

(87) PCT Pub. No.: WO2014/065500
PCT Pub. Date: May 1, 2014

(65) Prior Publication Data
US 2015/0205198 A1    Jul. 23, 2015

(30) Foreign Application Priority Data
Oct. 24, 2012    (KR) .................. 10-2012-0118491

(51) Int. Cl.
*G03F 7/09*    (2006.01)
*G03F 7/20*    (2006.01)
*G03F 7/38*    (2006.01)
*G03F 7/004*   (2006.01)
*G03F 7/00*    (2006.01)

(52) U.S. Cl.
CPC ............. *G03F 7/004* (2013.01); *G03F 7/0035* (2013.01); *G03F 7/094* (2013.01)

(58) Field of Classification Search
CPC ............ G03F 7/09; G03F 7/091; G03F 7/095; G03F 7/11; G03F 7/20; G03F 7/38; G03F 7/40
See application file for complete search history.

(56) References Cited

U.S. PATENT DOCUMENTS

| | | | |
|---|---|---|---|
| 2008/0305441 A1* | 12/2008 | Yoon et al. | 430/323 |
| 2011/0230058 A1* | 9/2011 | Sakamoto et al. | 438/763 |
| 2012/0153511 A1* | 6/2012 | Song et al. | 257/786 |

FOREIGN PATENT DOCUMENTS

| | | | |
|---|---|---|---|
| JP | 2005-250434 | * | 9/2005 |
| KR | 10-2008-0014646 A | | 2/2008 |
| KR | 10-2009-0034381 A | | 4/2009 |
| KR | 10-2010-0009506 A | | 1/2010 |
| KR | 10-2010-0072660 A | | 7/2010 |
| KR | 10-2011-0079200 A | | 7/2011 |
| KR | 10-2011-0079201 A | | 7/2011 |
| TW | 201009503 A1 | | 3/2010 |
| TW | 201134799 A1 | | 10/2011 |

OTHER PUBLICATIONS

Machine translation of JP 2005-250434, published on Sep. 15, 2005.*
Search Report dated Jan. 8, 2015 in corresponding Taiwanese Patent Application No. 102037992.

* cited by examiner

*Primary Examiner* — Anca Eoff
(74) *Attorney, Agent, or Firm* — Lee & Morse, P.C.

(57) ABSTRACT

Disclosed are a polymer represented by the Chemical Formula 1, a monomer represented by the Chemical Formula 2, and a solvent, wherein the monomer is included in the same or a higher amount than the polymer, and a method of forming patterns using the same.

15 Claims, No Drawings

HARD MASK COMPOSITION AND METHOD FOR FORMING PATTERN USING SAME

TECHNICAL FIELD

A hardmask composition and a method of forming patterns are disclosed.

BACKGROUND ART

Recently, the semiconductor industry has developed to an ultra-fine technique having a pattern of several to several tens nanometer size. Such ultra-fine technique essentially needs effective lithographic techniques.

The typical lithographic technique includes providing a material layer on a semiconductor substrate; coating a photoresist layer thereon; exposing and developing the same to provide a photoresist pattern; and etching the material layer using the photoresist pattern as a mask.

Nowadays, according to small-sizing the pattern to be formed, it is difficult to provide a fine pattern having an excellent profile by only above-mentioned typical lithographic technique. Accordingly, a photoresist underlayer, called a hardmask layer, may be formed between the material layer and the photoresist layer to provide a fine pattern.

The hardmask layer plays a role of an intermediate layer for transferring the fine pattern of photoresist to the material layer through the selective etching process. Accordingly, the hardmask layer requires to have characteristics such as heat resistance, etch resistance, or the like to be tolerated during the multiple etching processes.

In addition, according to widening the application range of hardmask layer, the hardmask layer may be formed on a predetermined pattern by the spin-on coating method. In this case, the gap-fill characteristics of filling the hardmask composition in gap between patterns and the planarization characteristics are also required.

DISCLOSURE

Technical Problem

One embodiment provides a hardmask composition that satisfies gap-fill characteristics while ensuring heat resistance and etch resistance.

Another embodiment provides a method of forming patterns using the hardmask composition.

Technical Solution

According to one embodiment, provide is a hardmask composition including a polymer represented by the following Chemical Formula 1, a monomer represented by the following Chemical Formula 2, and a solvent, wherein the monomer is included in the same or a higher amount than the polymer.

[Chemical Formula 1]

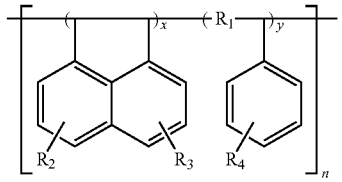

[Chemical Formula 2]

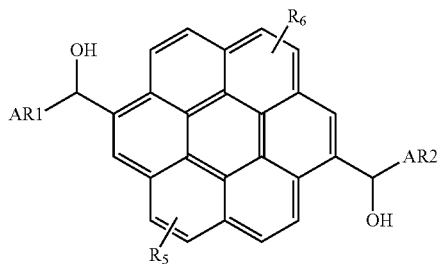

In the above Chemical Formula 1 or 2, $R_1$ is a single bond or a substituted or unsubstituted C1 to C10 alkylene group, $R_2$ to $R_6$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof, AR1 and AR2 are each independently a substituted or unsubstituted C6 to C20 aryl group, x+y=1, 0≤x≤1, and 0≤y≤1, and n is an integer ranging from 1 to 200.

The polymer and the monomer may be included in a weight ratio of about 1:9 to about 5:5.

The AR1 and AR2 may each independently include at least one selected from groups listed in the following Group 1.

[Group 1]

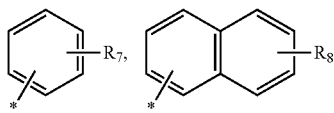

$R_7$, and $R_6$ are independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof.

The polymer may he represented by the foowing Chemical Formula 1a.

[Chemical Formula 1a]

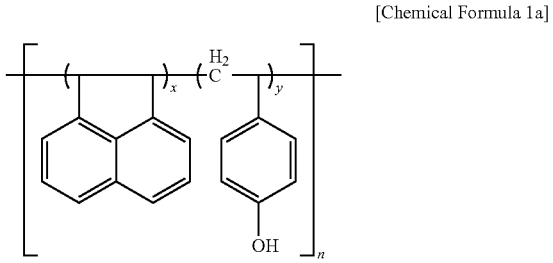

In the above Chemical Formula 1a,
x+y=1, 0≤x≤1, and 0≤y≤1, and
n is an integer ranging from 1 to 200.

The monomer may be represented by one of the following Chemical Formulae 2a to 2d.

[Chemical Formula 2a]

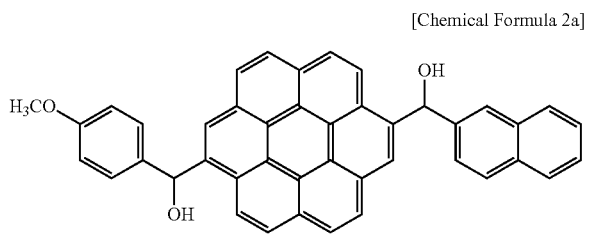 [SMILES: COc1ccc(C(O)c2cc3ccc4ccc5c(C(O)c6ccc7ccccc7c6)cc6ccc7ccc2c2c7c6c5c4c32)cc1]

[Chemical Formula 2b]

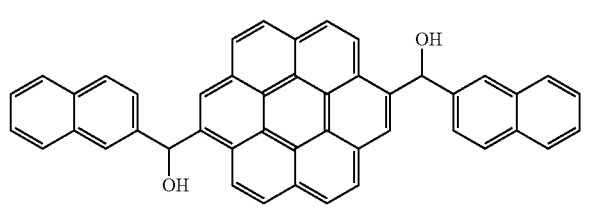

[Chemical Formula 2c]

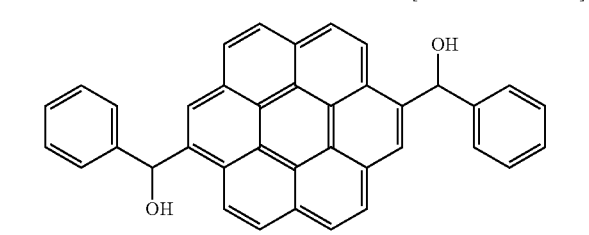

[Chemical Formula 2d]

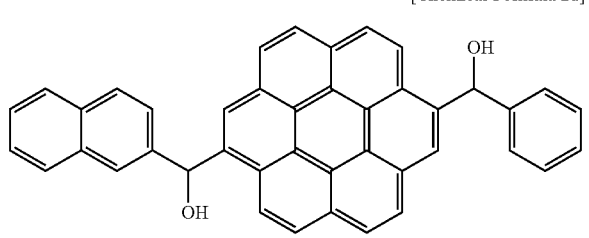

The polymer may have a weight average molecular weight of about 1,000 to 100,000 g/mol.

The total amount of the polymer and the monomer may be about 1 to 50 parts by weight based on 100 parts by weight of the solvent.

The hardmask composition may further include at least one of a surfactant, an acid catalyst, or a cross-linking agent.

The surfactant, acid catalyst or cross-linking agent may be included in each amount of 0.001 to 3 parts by weight based on100 parts by weight of the hardmask composition.

According to another embodiment, a method of forming patterns includes providing a material layer on a substrate, applying the hardmask composition on the material layer, heat-treating the hardmask composition to form a hardmask layer, forming a silicon-containing thin film on the hardmask layer, forming a photoresist layer on the silicon-containing thin film, exposing and developing photoresist layer to form a photoresist pattern, selectively removing the silicon-containing thin film and the hardmask layer using the photoresist pattern to expose a part of the material layer, and etching an exposed part of the material layer.

After forming the silicon-containing thin film, a bottom anti-reflective coating (BARC) may be further formed on the silicon-containing thin film.

The hardmask composition may be applied using a spin-on coating method.

The hardmask layer may be heat-treated at about 150 to 500° C.

Advantageous Effects

Characteristics such as heat resistance, etch resistance, film density, and gap-fill characteristics that are required in the hardmask layer may be improved.

BEST MODE

Exemplary embodiments of the present invention will hereinafter be described in detail, and may be easily performed by those who have common knowledge in the related art. However, this disclosure may be embodied in many different forms and is not construed as limited to the exemplary embodiments set forth herein.

In the specification, when a definition is not otherwise provided, the term 'substituted' refers to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C4 ether group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a heterocycloalkyl group, and a combination thereof, instead of at least one hydrogen of a compound.

In the specification, when a definition is not otherwise provided, the term "hetero" refers to one including at least one heteroatom selected from N, O, S, and P.

Hereinafter, a hardmask composition according to one embodiment is described.

A hardmask composition according to one embodiment includes a polymer represented by the following Chemical Formula 1 a monomer represented by the following Chemical Formula 2, and a solvent.

[Chemical Formula 1]

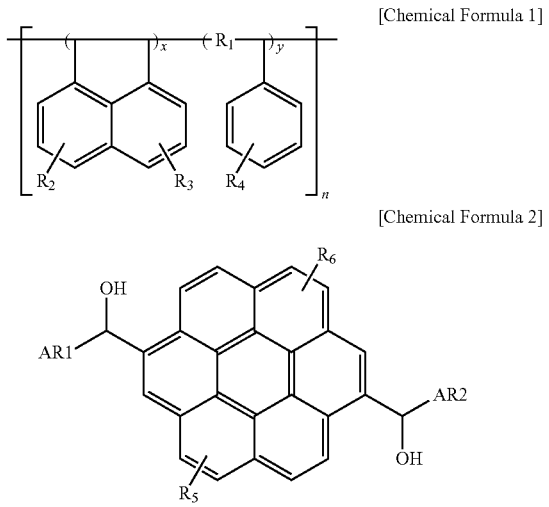

[Chemical Formula 2]

In the above Chemical Formula 1 or 2.

$R_1$ is a single bond or a substituted or unsubstituted C1 to C10 alkylene group.

$R_2$ to $R_6$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof.

AR1 and AR2 are each independently a substituted or unsubstituted C6 to C20 aryl group, x+y=1, 0≤x≤1, and 0≤y≤1, and n is an integer ranging from 1 to 200.

The $R_2$ to $R_6$ may each independently substitute any hydrogen bonded to the aromatic ring, respectively and one or more of $R_2$ to $R_6$ may be present.

The AR1 and AR2 may each independently include at least one selected from groups listed in the following Group 1.

[Group 1]

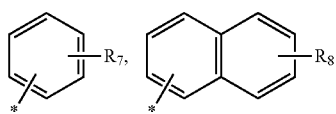

$R_7$ and $R_8$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof, The polymer may be represented by, for example the following Chemical Formula 1a.

[Chemical Formula 1a]

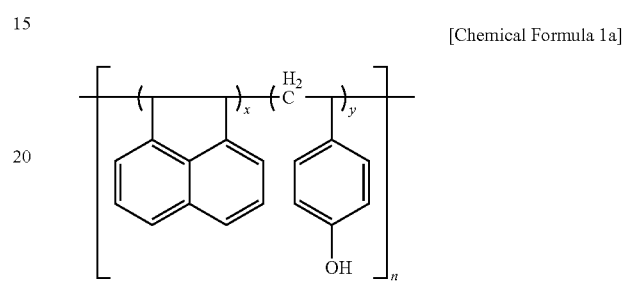

In the above Chemical Formula 1a, x+y=1, 0≤x≤1, and 0≤y≤1, and n is an integer ranging from 1 to 200.

The polymer may have a weight average molecular weight of about 1,000 to 100,000 g/mol.

The polymer may include one kind of a polymer at alone or a mixture of two or more kinds of a polymer.

The monomer may be, for example represented by one of the following Chemical Formulae 2a to 2d.

[Chemical Formula 2a]

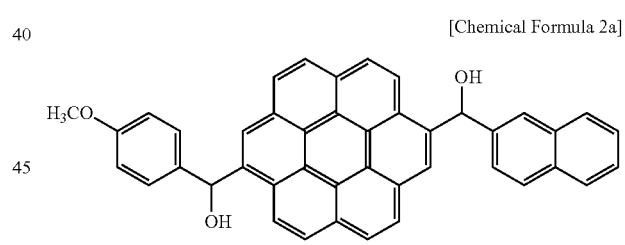

[Chemical Formula 2b]

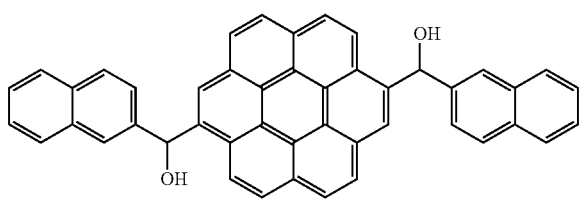

[Chemical Formula 2c]

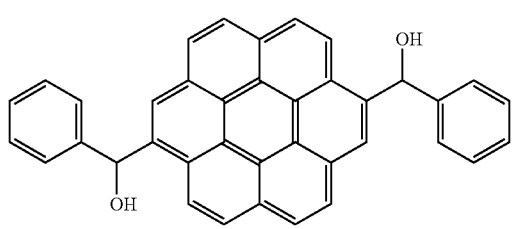

-continued

[Chemical Formula 2d]

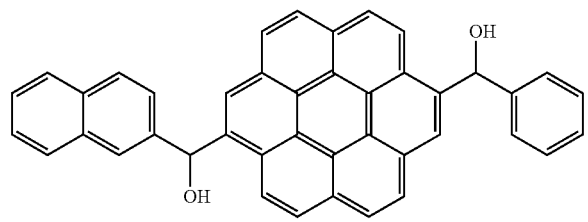

The monomer may include one kind of a monomer at alone or a mixture of two or more kinds of a monomer.

The monomer and the polymer may have rigid characteristics due to a polycyclic aromatic group, and may absorb light of a short wavelength such as 193 nm and/or 248 nm effectively, Particularly, the monomer has high dissolubility for a solvent due to a hydroxy group (—OH) linked to the polycyclic aromatic group as a substituent and thus may be prepared as a solution using a spin-on coating method, and has high electron mobility by having a hydroxy group (—OH) and an aryl group simultaneously, and thus excellent cross-linking characteristics may be provided, The hardmask composition according to the embodiment may include the monomer in the same or a higher amount than the polymer. For example, the polymer and the monomer may be included in a weight ratio of about 1:9 to about 5:5.

In this way, in the embodiment, the polymer and the monomer are included as a mixture, and the monomer is included in the same or a higher amount than the polymer, and thereby etch resistance and heat resistance of a hardmask layer may be remarkably improved and also gap-fill characteristics to fill between patterns may be furthermore improved when a hardmask layer is formed using spin-on coating method compared with a composition including the only polymer or the only monomer.

The solvent may be anything having sufficient dissolubility or dispersion for the monomer, but may be, for example at least one selected from propylene glycol, propylene glycol diacetate, methoxy propanediol, diethylene glycol, diethylene glycol butylether, tri(ethylene glycol) monomethyl ether, propylene glycol monomethyl ether, propylene glycol monomethyl ether acetate, cyclohexanone (or referred to be 'anone'), ethyllactate, gamma-butyrolactone, and acetyl acetone.

The total amount of the polymer and the monomer may be included in an amount of about 1 to 50 parts by weight based on 100 parts by weight of the solvent. Within the range, the total amount of the polymer and the monomer may be included in an amount of about 3 to 30 parts by weight based on 100 parts by weight of the solvent. When the polymer and the monomer are included within the range, etch resistance, heat resistance, and a film density of a hardmask layer may be more remarkably improved and gap-fill characteristics may be improved when a hardmask layer is formed using spin-on coating method.

The hardmask composition may further include at least one of a surfactant, an acid catalyst, or a cross-linking agent.

The surfactant may include, for example an alkyl benzene sulfonate salt, an alkyl pyridinium salt, a polyethylene glycol, a quaternary ammonium salt, and the like, but is not limited thereto.

The acid catalyst may be preferably a thermally activated acid catalyst.

The acid catalyst may be an organic acid such as p-toluene sulfonic acid monohydrate, and a thermal acid generator (TAG) may be used for storage stability. The thermal acid generator is an acid generator to generate acid when being treated with heat, and may be, for example pyridinium p-toluene sulfonate, 2,4,4,6-tetrabromocyclohexadienone, benzoin tosylate, 2-nitrobenzyltosylate, alkylester of organic sulfonic acid, and the like.

The cross-linking agent may cross-link a repeating unit of a polymer with heat, and may be an amino resin such as an etherified amino resin: a glycoluril compound such as a compound represented by the following Chemical Formula A; a bisepoxy compound such as a compound represented by the following Chemical Formula B; melamine or a derivative thereof such as methoxymethyl melamine, N-butoxymethyl melamine or a melamine derivative represented by the following Chemical Formula C; or a mixture thereof.

[Chemical Formula A]

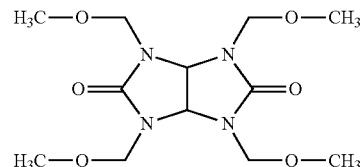

[Chemical Formula B]

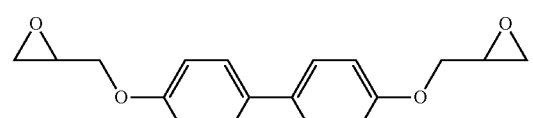

[Chemical Formula C]

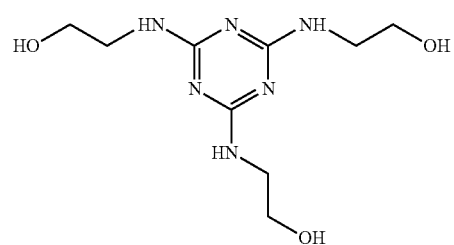

The surfactant, acid catalyst or cross-linking agent may be included in each amount of about 0.001 to 3 parts by weight based on 100 parts by weight of the hardmask composition. Within the range, optical properties of the hardmask composition are not changed and solubility and cross-linking may be ensured.

Hereafter, a method for forming patterns by using the hardmask composition is described.

A method of forming patterns according to one embodiment includes providing a material layer on a substrate, applying the hardmask composition on the material layer, heat-treating the hardmask composition to form a hardmask layer, forming a silicon-containing thin film on the hardmask layer, forming a photoresist layer on the silicon-containing thin film, exposing and developing the photoresist layer to form a photoresist pattern, selectively removing the silicon-containing thin film and the hardmask layer using the photoresist pattern to expose a part of the material layer, and etching an exposed part of the material layer.

The substrate may be, for example, a silicon wafer, a glass substrate, or a polymer substrate, The material layer is a material to be finally patterned, for example a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hardmask composition may be applied by spin-on coating in a form of a solution. Herein, the hardmask composition may be applied at a thickness, for example about 100 Å to 10,000 Å.

The heat-treating the hardmask composition may be performed, for example about 150 to 500° C for about 10 seconds to 10 minutes. During heat-treating, the monomer and polymer may cause a mutual cross-linking reaction.

The silicon-containing thin film may be a thin film made of, for example silicon nitride or silicon oxide.

A bottom anti-reflective coating (BARC) may be formed on the silicon-containing thin film.

The exposure of the photoresist layer may be performed using for example ArF, KrF, or EUV. Also, after the exposure, heat-treating may be performed at about 100 to 500° C.

The etching process of the exposed part of the material layer may be performed through a dry etching process using an etching gas, and the etching gas may be, for example CHF$_3$, CF$_4$, Cl$_2$, BCl$_3$, and a mixed gas thereof, The etched material layer may be formed in a plurality of pattern, and the plurality of pattern may be a metal pattern, a semiconductor pattern, an insulation pattern, and the like, for example diverse pattern of a semiconductor integrated circuit device.

Mode For Invention

Hereinafter, the present disclosure is illustrated in more detail with reference to examples. However, these examples are exemplary, and the present disclosure is not limited thereto.

SYNTHESIS OF POLYMER

Synthesis Example 1

91.3 g of acenaphthylene, 206.6 g of 4-acetoxystyrene, 1.97 g of 2,2'-azobisisobutyronitrile (AIBN), and 161.48 g of propylene glycol monomethyl ether acetate (PGMEA) were put in a 500 mL four-necked flask equipped with a thermometer, condenser, a nitrogen gas-purging nozzle, and an agitator, and the solution was degassed for 20 minutes. Subsequently, the solution was heated at 70° C and agitated for 24 hours. Then, the solution was cooled down to room temperature, precipitated in methanol, and dried in a 45° C oven for 24 hours. Then, the obtained product was mixed with 1,4-dioxane and hydrazine anhydride (the product: 1,4-dioxane:hydrazine anhydride=1:8:1, v/v/v) for hydrolysis. The mixture was agitated at room temperature for 12 hours, and a polymer was separated and precipitated by adding methanol in an excessive amount thereto in a drop-wise fashion while the mixture was agitated at a fast speed. The polymer was filtered and washed with methanol and then, dried at 45° C under vacuum for 24 hours, obtaining a polymer represented by the following Chemical Formula 1a.

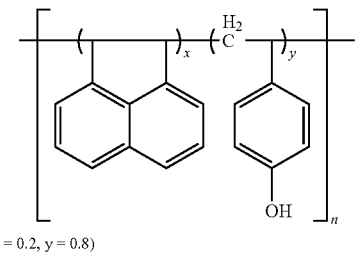

[Chemical Formula 1a]

(x = 0.2, y = 0.8)

The weight average molecular weight of the polymer measured by gel permeation chromatography (GPC) was 10,800 g/mol, and the polydispersity of the polymer was 1.3.

SYNTHESIS OF MONOMER

Synthesis Example 2

<First Step>

30.04 g (100 mmol) of coronene (a compound I), 17.1 g (100 mmol) of 4-methoxybenzoyl chloride, 19.1 g (100 mmol) of 2-naphthoyl chloride, and 371 g of dichloroethane were dissolved in a flask. 26.7 g (200 mmol) of aluminum (III) chloride was slowly added thereto, and the mixture was heated up to 80° C and agitated for 24 hours. When the reaction was complete, the resultant was cooled down to room temperature and neutralized by adding a potassium hydroxide aqueous solution thereto. An organic layer was separated and concentrated, obtaining 55.3 g of the following compound II. The yield of the compound was 93.9%.

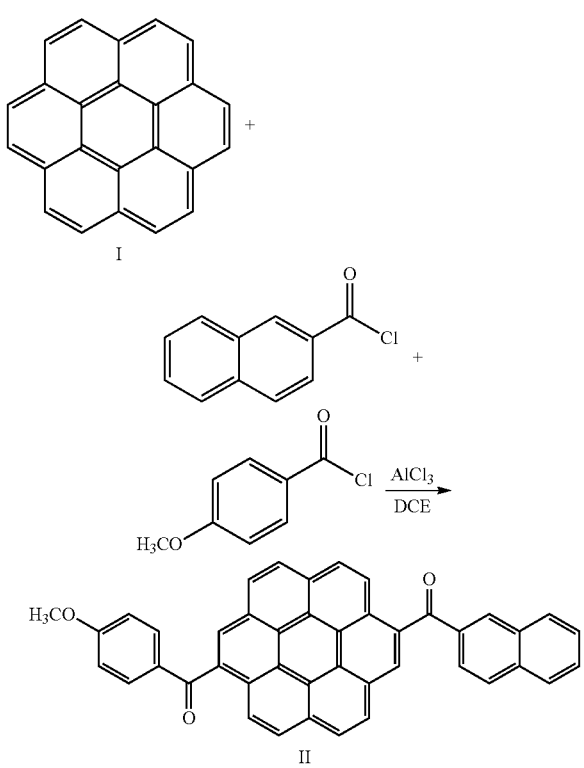

<Second Step>

58.87 g (100 mmol) of the compound II was dissolved in 381 g of a mixed solvent of methanol and water 1:1=v/v).

37.83 g (1.0 mol) of sodium borohydride was slowly added to the solution, and the mixture was agitated for 24 hours. When the reaction was complete, a 10% HCl aqueous solution was added to the resultant for neutralization, and ethyl acetate was added thereto for extraction. The extracted organic layer was concentrated under a reduced pressure, obtaining 50.3 g of a monomer represented by the following Chemical Formula 2a. The yield of the monomer was 84.9%.

[Chemical Formula 2a]

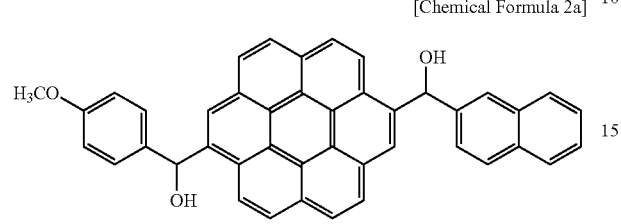

Synthesis Example 3

A monomer represented by the following Chemical Formula 2b was obtained according to the same method as Synthesis Example 2 except for using 200 mmol of naphthoyl chloride instead of 100 mmol of 4-methoxybenzoyl chloride and 100 mmol of 2-naphthoyl chloride. The yield of the monomer was 73.0%.

[Chemical Formula 2b]

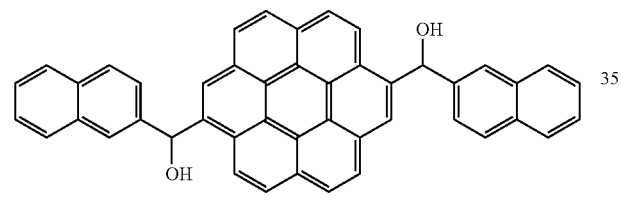

Synthesis Example 4

A monomer represented by the following Chemical Formula 2c was synthesized according to the same method as Synthesis Example 2 except for using 200 mmol of benzoyl chloride instead of 100 mmol of 4-methoxybenzoyl chloride and 100 mmol of 2-naphthoyl chloride. The yield of the monomer was 81.0%.

[Chemical Formula 2c]

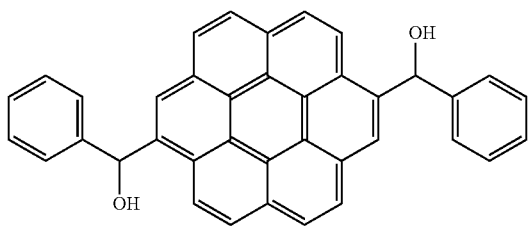

Synthesis Example 5

A monomer represented by following Chemical Formula 2d was synthesized according to the same method as Synthesis Example 2 except for using 100 mmol of benzoyl chloride and 100 mmol of 2-naphthoyl chloride instead of 100 mmol of 4-methoxybenzoyl chloride and 100 mmol of 2-naphthoyl chloride. The yield of the monomer was 82.0%.

[Chemical Formula 2d]

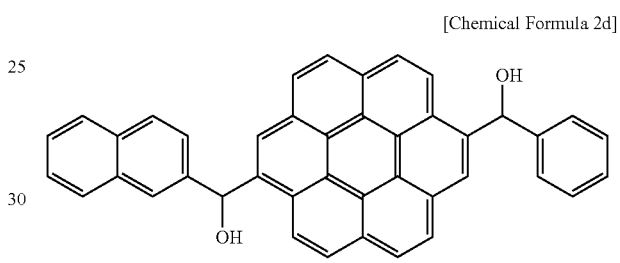

Comparative Synthesis Example 8.97 g of 9,9-bis(4-hydroxyphenyl)fluorene (BPF) and 0.92 g paraformaldehyde were put in 99.27 g of propylene glycol monon ethyl ether acetate (PGMEA) and then, agitated and dissolved for 20 minutes. 0.3 g of diethyl sulfate was added thereto, and the mixture was heated at 130° C for 8 hours. Subsequently, 52.94 g of the polymer according to Synthesis Example 1 was added to the reactant, and the mixture was heated at the same temperature for 4 hours. The obtained copolymer was precipitated in methanol and then, dissolved in 20 g of propylene glycol monomethyl ether acetate (PGMEA) and reprecipitated in methanol, obtaining a copolymer represented by the following Chemical Formula 3.

[Chemical Formula 3]

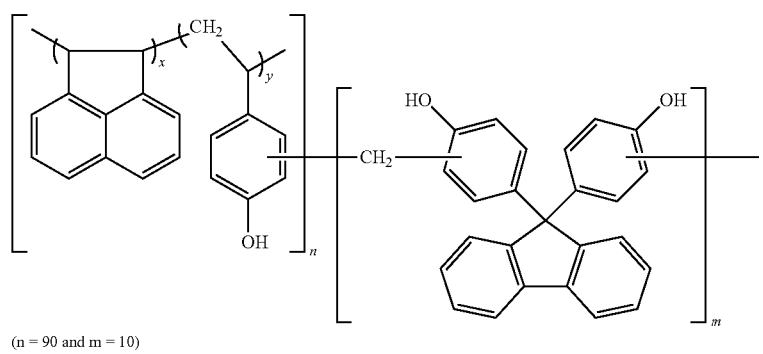

(n = 90 and m = 10)

The weight average molecular weight of the obtained polymer measured by gel permeation chromatography (GPC) was 16,500 g/mol, and the polydispersity of the polymer was 1.7.

PREPARATION OF HARDMASK COMPOSITION

Example 1-1

A hardmask composition was prepared by dissolving 0.89 of the polymer of Synthesis Example 1 and the monomer of Synthesis Example 2 (a weight ratio of 5:5) 2 mg of pyridinium p-toluene sulfonate as an acid catalyst, and 0.2 g of glycoluril compound represented by the following Chemical Formula A as a cross-linking agent in 9 g of propylene glycol monomethyl ether acetate (PGMEA) and filtering the solution.

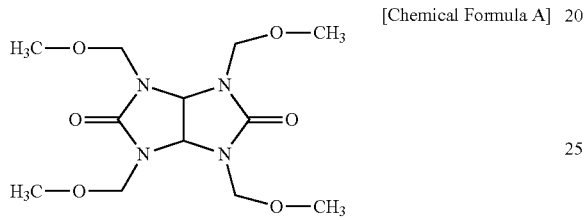

[Chemical Formula A]

Example 1-2

A hardmask composition was prepared according to the same method as Example 1-1 except for using the polymer of Synthesis Example 1 and the monomer of Synthesis Example 2 in a weight ratio of 3:7.

Example 1-3

A hardmask composition was prepared according to the same method as Example 1-1 except for using the polymer of Synthesis Example 1 and the monomer of Synthesis Example 2 in a weight ratio of 1:9.

Example 2

A hardmask composition was prepared according to the same method as Example 1-1 except for using the monomer of Synthesis Example 3 instead of the monomer of Synthesis Example 2.

Example 3

A hardmask composition was prepared according to the same method as Example 1-1 except for using the monomer of Synthesis Example 4 instead of the monomer of Synthesis Example 2.

Example 4

A hardmask composition was prepared according to the same method as Example 1-1 except for using the monomer of Synthesis Example 5 instead of the monomer of Synthesis Example 2.

Comparative Example 1

A hardmask composition was prepared according to the same method as Example 1-1 except for using only the polymer of Synthesis Example 1 instead of the polymer of Synthesis Example 1 and the monomer of Synthesis Example 2.

Comparative Example 2

A hardmask composition was prepared according to the same method as Example 1-1 except for using only the monomer of Synthesis Example 2 instead of the polymer of Synthesis Example 1 and the monomer of Synthesis Example 2.

Comparative Example 3

A hardmask composition was prepared according to the same method as Example 2 except for using only the monomer of Synthesis Example 3 instead of the polymer of Synthesis Example 1 and the monomer of Synthesis Example 3.

Comparative Example 4

A hardmask composition was prepared according to the same method as Example 3 except for using only the monomer of Synthesis Example 4 instead of the polymer of Synthesis Example 1 and the monomer of Synthesis Example 4.

Comparative Example 6

A hardmask composition was prepared according to the same method as Example 4 except for using only the monomer of Synthesis Example 5 instead of the polymer of Synthesis Example 1 and the monomer of Synthesis Example 5.

Comparative Example 6

A hardmask composition was prepared according to the same method as Example 1-1 except for using only the copolymer of Comparative Synthesis Example instead of the polymer of Synthesis Example 1 and the monomer of Synthesis Example 2.

Comparative Example 7

A hardmask composition was prepared according to the same method as Example 1-1 except for using the polymer of Synthesis Example 1 and the monomer of Synthesis Example 2 in a weight ratio of 7:3.

Comparative Example 8

A hardmask composition was prepared according to the same method as Example 1-1 except for using the polymer of Synthesis Example 1 and the monomer of Synthesis Example 2 in a weight ratio of 9:1.

Evaluation 1: Etch Resistance

The hardmask compositions according to Examples 1.1 to 4 and Comparative Examples 1 to 8 were respectively spin-coated on a silicon wafer and heat-treated on a hot plate at 240° C for 1 minute to form each thin film. The thicknesses of the thin films were measured by using a thin film thickness measuring device made by K-MAC Co.

Subsequently, the thin films were dry-etched by using $CF_4$ for 2 minutes, and then, the thickness of the thin films was measured.

The initial thickness of the thin films and the thickness of the thin films after the dry etching were used to calculate a bulk etch rate (BER) according to the following Calculation Equation 1.

Etch rate (BER, Å/minute)=(initial thickness of thin film−thickness of the thin film after etching)/etching time(minute)  [Calulation Equation 1]

Evaluation 2: Heat Resistance

The hardmask compositions according to Examples 1-1 to 4 and Comparative Examples 1 to 8 were respectively spin-on coated on a silicon wafer and heat-treated on a hot plate at 240° C for 1 minute to form each thin film. The thicknesses of the thin films were measured by using a thin film thickness measuring device made by K-MAC Co.

Subsequently, the thin films were heat-treated at 400° C for 2 minutes, and the thickness of the thin films was measured again.

The initial thickness of thin films and the thickness of the thin films after the heat treatment were used to calculate the thickness decrease rate of the thin films according to the following Calculation Equation 2.

Thickness decrease ratio of thin film (%)=(initial thickness of thin film−thickness of the thin film after heat treatment)/initial thickness of the thin film×100.  [Calculation Equation 2]

Evaluation 3: Film Density

The hardmask compositions according to Examples 1-1 to 4 and Comparative Examples 1 to 8 were respectively spin-on coated on a silicon wafer and heat-treated on a hot plate at 400° C for 2 minutes, forming each thin film.

The film densities of the thin films were used by using an X-ray diffractometer (XRD) (X'Pert PRO MPD, PANalytical Inc.).

Evaluation 4: Gap-Fill Characteristics

The hardmask compositions according to Examples 1-1 to 4 and Comparative Exampled 1 to 8 were respectively spin-on coated on a patterned silicon wafer and heat-treated at 240° C, and gap-fill characteristics of the films were examined by using a V-SEM equipment.

The gap-fill characteristics were evaluated by examining the cross section of the pattern with an scanning electron microscope (SEM) to see if a void occurred or not.

No void: ○, a small amount of voids: Δ a large amount of voids: x.

The etch resistance, heat resistance, film density, and gap-fill characteristic results are provided in Table 1.

TABLE 1

|  | Etch resistance <etch rate> (BER, Å/minute) | Heat resistance <thickness decrease rate of thin film> (%) | Film density (g/cm²) | Gap-fill characteristics |
|---|---|---|---|---|
| Example 1-1 | 41 | 3 | 1.54 | ○ |
| Example 1-2 | 50 | 7 | 1.47 | ○ |
| Example 1-3 | 53 | 6 | 1.40 | ○ |
| Example 2 | 43 | 4 | 1.52 | ○ |
| Example 3 | 42 | 4 | 1.51 | ○ |
| Example 4 | 42 | 4 | 1.51 | ○ |
| Comparative Example 1 | 73 | 12 | 1.22 | x |
| Comparative Example 2 | 50 | 7 | 1.38 | ○ |
| Comparative Example 3 | 51 | 8 | 1.37 | ○ |
| Comparative Example 4 | 52 | 8 | 1.37 | ○ |
| Comparative Example 5 | 52 | 8 | 1.37 | ○ |
| Comparative Example 6 | 62 | 10 | 1.28 | Δ |
| Comparative Example 7 | 55 | 9 | 1.42 | Δ |
| Comparative Example 8 | 62 | 11 | 1.25 | x |

Referring Table 1, the hardmask compositions according to Examples 1-1 to 4 showed improved characteristics required of a hardmask layer compared with the hardmask compositions according to Comparative Examples 1 to 8 based on the etch resistance, heat resistance, film density and gap-fill characteristic results.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A hardmask composition, comprising:
   a polymer including a repeating unit represented by the following Chemical Formula 1,
   a monomer represented by the following Chemical Formula 2, and
   a solvent,
   wherein the monomer is included in the same or a higher amount than the polymer:

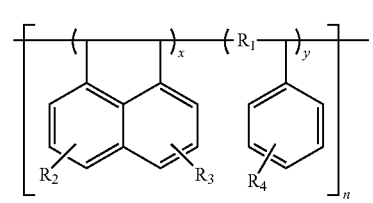

[Chemical Formula 1]

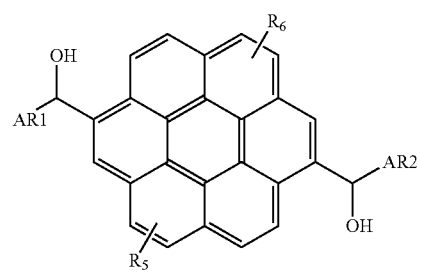

[Chemical Formula 2]

wherein, in the above Chemical Formulae 1 and 2,
$R_1$ is a single bond or a substituted or unsubstituted C1 to C10 alkylene group,
$R_2$ to $R_6$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof, AR1 and AR2 are each independently a substituted or unsubstituted C6 to C20 aryl group, x+y=1, 0≤x≤1 and 0≤y≤1, and n is an integer ranging from 1 to 200.

2. The hardmask composition of claim 1, wherein the polymer and the monomer are included in a weight ratio of about 1:9 to about 5:5.

3. The hardmask composition of claim 1, wherein the AR1 and AR2 each independently include at least one selected from groups listed in the following Group 1:

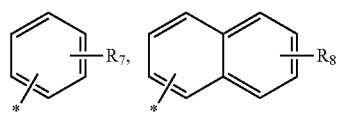

[Group 1]

wherein, $R_7$ and $R_8$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, or a combination thereof.

4. The hardmask composition of claim 1, wherein the polymer includes a repeating unit represented by the following Chemical Formula 1 a:

[Chemical Formula 1a]

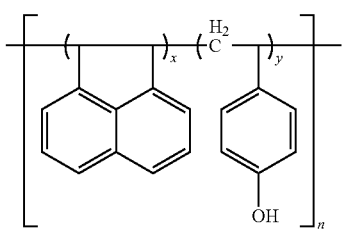

wherein, in the above Chemical Formula 1 a, x+y=1, 0≤x≤1, and 0≤y≤1, and n is an integer ranging from 1 to 200.

5. The hardmask composition of claim 1, wherein the monomer is represented by one of the following Chemical Formulae 2a to 2d:

[Chemical Formula 2a]

[Chemical Formula 2b]

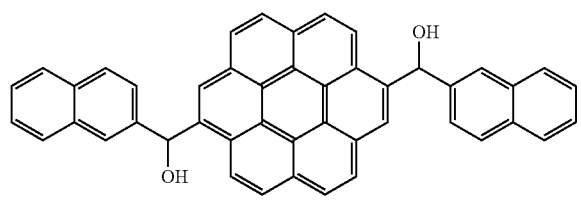

[Chemical Formula 2c]

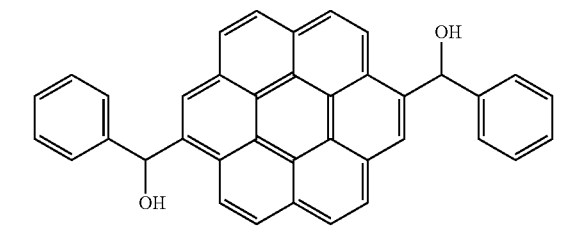

[Chemical Formula 2d]

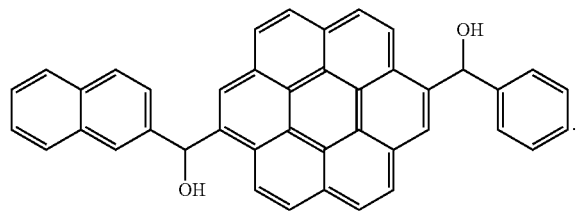

6. The hardmask composition of claim 1, wherein the polymer has a weight average molecular weight of 1,000 to 100,000 g/mol.

7. The hardmask composition of claim 1, wherein the total amount of the polymer and the monomer is 1 to 50 parts by weight based on 100 parts by weight of the solvent.

8. The hardmask composition of claim 1, further comprising at least one of a surfactant, an acid catalyst, or a cross-linking agent.

9. The hardmask composition of claim 8, wherein the surfactant, acid catalyst, or cross-linking agent are included in an amount of 0.001 to 3 parts by weight based on 100 parts by weight of the hardmask composition.

10. A method of forming patterns, the method comprising:
providing a material layer on a substrate,
applying the hardmask composition of claim 1 on the material layer
heat-treating the hardmask composition to form a hardmask layer,
forming a silicon-containing thin film on the hardmask layer, forming a photoresist layer on the silicon-containing thin film, exposing and developing the photoresist layer to form a photoresist pattern, selectively removing the silicon-containing thin film and the hardmask layer using the photoresist pattern to expose a part of the material layer, and etching an exposed part of the material layer.

11. The method of claim 10, wherein after forming the silicon-containing thin film, a bottom anti-reflective coating (BARC) is further formed on the silicon-containing thin film.

12. The method of claim 10, wherein the hardmask composition is applied using a spin-on coating method.

13. The method of claim 10, wherein the hardmask layer is heat-treated at 150 to 500° C.

14. The hardmask composition of claim 1, wherein the monomer is included in the composition in an amount greater than an amount in which the polymer is included in the composition.

15. The hardmask composition of claim 1, wherein AR1 and AR2 are different from one another.

* * * * *